(12) United States Patent
Yonezawa et al.

(10) Patent No.: US 9,762,232 B2
(45) Date of Patent: Sep. 12, 2017

(54) SEMICONDUCTOR DEVICE

(71) Applicant: FUJITSU LIMITED, Kawasaki-shi, Kanagawa (JP)

(72) Inventors: Yu Yonezawa, Sagamihara (JP); Yoshiyasu Nakashima, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/556,597

(22) Filed: Dec. 1, 2014

(65) Prior Publication Data

US 2015/0188534 A1 Jul. 2, 2015

(30) Foreign Application Priority Data

Dec. 27, 2013 (JP) .................. 2013-272729

(51) Int. Cl.
*H03K 17/687* (2006.01)
*H03K 17/16* (2006.01)

(52) U.S. Cl.
CPC .................. *H03K 17/165* (2013.01)

(58) Field of Classification Search
USPC ......................................... 327/427
See application file for complete search history.

(56) References Cited

U.S. PATENT DOCUMENTS

| 5,774,792 A * | 6/1998 | Tanaka | H03K 17/693 |
| | | | 333/103 |
| 7,924,066 B2 * | 4/2011 | Gagne | H03K 19/0008 |
| | | | 327/108 |

| 2012/0241756 A1 | 9/2012 | Zhang et al. |
| 2012/0241819 A1 | 9/2012 | Zhang |
| 2012/0241820 A1 | 9/2012 | Briere et al. |
| 2013/0234208 A1 | 9/2013 | Bramian et al. |

FOREIGN PATENT DOCUMENTS

| EP | 2503693 | 9/2012 |
| JP | 10-248237 | 9/1998 |
| JP | 2009-253699 | 10/2009 |
| JP | 2012-199547 | 10/2012 |

OTHER PUBLICATIONS

JPOA—Office Action of Japanese Patent Application No. 2013-272729 dated May 23, 2017, with full English translation of the Office Action.

* cited by examiner

*Primary Examiner* — Lincoln Donovan
*Assistant Examiner* — Patrick Chen
(74) *Attorney, Agent, or Firm* — Fujitsu Patent Center (57) ABSTRACT

A semiconductor device includes: a first field-effect transistor configured to have a source connected to a reference potential node; a second field-effect transistor configured to have a source connected to a drain of the first field-effect transistor, and a gate connected to the source of the first field-effect transistor; a gate signal node configured to input a gate signal therein; a first resistor configured to be connected between the gate signal node and a gate of the first field-effect transistor; and a first capacitor and a switch circuit configured to be connected between a drain of the second field-effect transistor and the gate of the first field-effect transistor, in which the switch circuit is connected in series with the first capacitor.

12 Claims, 7 Drawing Sheets

SEMICONDUCTOR DEVICE

CROSS-REFERENCE TO RELATED APPLICATION

This application is based upon and claims the benefit of priority of the prior Japanese Patent Application No. 2013-272729, filed on Dec. 27, 2013, the entire contents of which are incorporated herein by reference.

FIELD

The embodiments discussed herein are directed to a semiconductor device.

BACKGROUND

There is known a driving circuit of a semiconductor element having a feedback circuit (refer to Patent Document 1, for example). In the feedback circuit, a cathode of a diode is connected to a gate of a semiconductor element, an anode of the diode is connected to a source of the semiconductor element, and a resistor is inserted to be connected between the gate and the cathode or between the source and the anode.

Further, there is known a normally-off composite semiconductor device performing an active oscillation control (refer to Patent Document 2, for example). There is provided a low-voltage device which forms the normally-off composite semiconductor device by being cascode-connected to a normally-on III-nitride power transistor. The low-voltage device has a reduced output resistance to cause a gain of the normally-off composite semiconductor device to be about 10000 or less.

Patent Document 1: Japanese Laid-open Patent Publication No. 2009-253699

Patent Document 2: Japanese Laid-open Patent Publication No. 2012-199547

The above-described feedback circuit can reduce a switching noise to make a driving circuit system of a switching element to be stably operated. However, when the feedback circuit is provided, a switching speed of the semiconductor element is sometimes lowered.

SUMMARY

A semiconductor device includes: a first field-effect transistor configured to have a source connected to a reference potential node; a second field-effect transistor configured to have a source connected to a drain of the first field-effect transistor, and a gate connected to the source of the first field-effect transistor; a gate signal node configured to input a gate signal therein; a first resistor configured to be connected between the gate signal node and a gate of the first field-effect transistor; and a first capacitor and a switch circuit configured to be connected between a drain of the second field-effect transistor and the gate of the first field-effect transistor, in which the switch circuit is connected in series with the first capacitor.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First Embodiment

Figure 1:
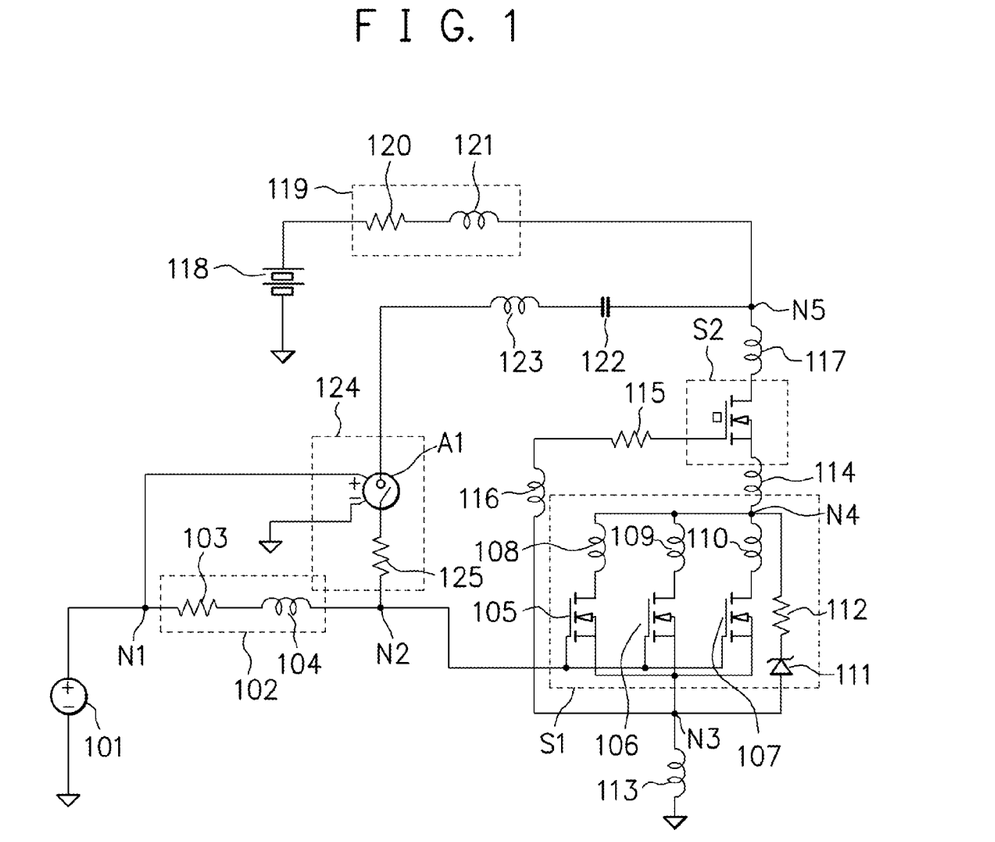
FIG. 1 is a diagram illustrating a configuration example of a semiconductor device according to a first embodiment.

FIG. 1 is a diagram illustrating a configuration example of a semiconductor device according to a first embodiment. A first field-effect transistor S1 has parallel-connected field-effect transistors 105 to 107, parasitic inductors 108 to 110, a parasitic diode 111, and a parasitic resistor 112. The first field-effect transistor S1 has a drain connected to a node N4, a gate connected to a node N2, and a source connected to a node N3. The field-effect transistor 105 has a drain connected to the node N4 via the parasitic inductor 108, a gate connected to the node N2, and a source connected to the node N3. The field-effect transistor 106 has a drain connected to the node N4 via the parasitic inductor 109, a gate connected to the node N2, and a source connected to the node N3. The field-effect transistor 107 has a drain connected to the node N4 via the parasitic inductor 110, a gate connected to the node N2, and a source connected to the node N3. The parasitic diode 111 has an anode connected to the node N3, and a cathode connected to the node N4 via the parasitic resistor 112. For example, each of the parasitic inductors 108 to 110 has 0.2 nH. The parasitic resistor 112 has 1µΩ.

The field-effect transistors 105 to 107 are normally-off n-channel MOS (metal oxide semiconductor) field-effect transistors. Therefore, when a voltage between the source and the gate is 0 V, each of the field-effect transistors 105 to 107 is turned into an off-state. The first field-effect transistor S1 corresponds to a normally-off n-channel MOS field-effect transistor having the parallel-connected field-effect transistors 105 to 107. Therefore, when a voltage between the source and the gate is 0 V, the first field-effect transistor S1 is turned into an off-state. Further, the number of the field-effect transistors 105 to 107 connected in parallel is set so that a current of each of the transistors does not exceed a rated current, and if the current becomes large, it is possible to employ a configuration in which the number of transistors connected in parallel is further increased.

The node N3 is connected to a reference potential node (ground potential node) via a parasitic inductor 113. The parasitic inductor 113 is a parasitic inductor of a wiring pattern and a package, and has 20 nH, for example.

The second field-effect transistor S2 has a drain connected to a node N5 via a parasitic inductor 117, a gate connected to the node N3 via a resistor 115 and a parasitic inductor 116, and a source connected to the node N4 via a parasitic inductor 114. The resistor 115 may be deleted. For example, each of the parasitic inductors 114, 116 and 117 has 0.2 nH. The resistor 115 has 5Ω. The second field-effect transistor S2 corresponds to a normally-on GaN (gallium nitride) high electron mobility transistor (HEMT). Therefore, when a voltage between the source and the gate is 0 V, the second field-effect transistor S2 is turned into an on-state. The high electron mobility transistor S2 is a transistor realizing higher speed and higher withstand voltage, compared to the MOS field-effect transistor S1. The node N5 is connected to a drain bias power supply (drain bias potential node) 118 via a load 119. The drain bias power supply 118 supplies a drain bias potential of 400 V, for example, to the node N5 via the load 119. The load 119 corresponds to a series-connected circuit of a resistor 120 and an inductor 121. For example, the resistor 120 has 40Ω. The inductor 121 has 0.5 μH. The first field-effect transistor S1 and the second field-effect transistor S2 are cascode-connected.

A gate signal generator 101 is connected to a gate signal node N1, and outputs a gate pulse signal whose low-level is 0 V and whose high-level is 5 V, to the gate signal node N1. A gate damping circuit 102 corresponds to a series-connected circuit of a first resistor 103 and a first inductor (parasitic inductor) 104, and is connected between the gate signal node N1 and the node N2. The gate damping circuit 102 can suppress an oscillation of the gate pulse signal. For example, the first resistor 103 has 10Ω. The parasitic inductor 104 has 5 nH.

A series-connected circuit (feedback circuit) formed of a first capacitor 122, a second inductor (parasitic inductor) 123 and a switch circuit 124 is connected between the node N5 and the node N2. For example, the first capacitor 122 has 20 pF. The parasitic inductor 123 has 5 nH. The switch circuit 124 has an equivalent circuit of a switch A1 and an on-resistor 125. For example, the on-resistor 125 has 10Ω. The switch A1 is turned on in accordance with the signal of the gate signal node N1.

Next, an operation of the semiconductor device will be described. When the gate signal generator 101 outputs the gate signal of 5 V, the field-effect transistors 105 to 107 are turned on. Since the second field-effect transistor S2 is the normally-on transistor, it is turned on when the field-effect transistors 105 to 107 are turned on. Consequently, the node N5 takes 0 V.

On the contrary, when the gate signal generator 101 outputs the gate signal of 0 V, the field-effect transistors 105 to 107 are turned off since the transistors are the normally-off transistors. Subsequently, since a gate potential with respect to a source potential becomes a negative potential, the second field-effect transistor S2 is turned off. Consequently, the node N5 takes 400 V.

Figure 2A:
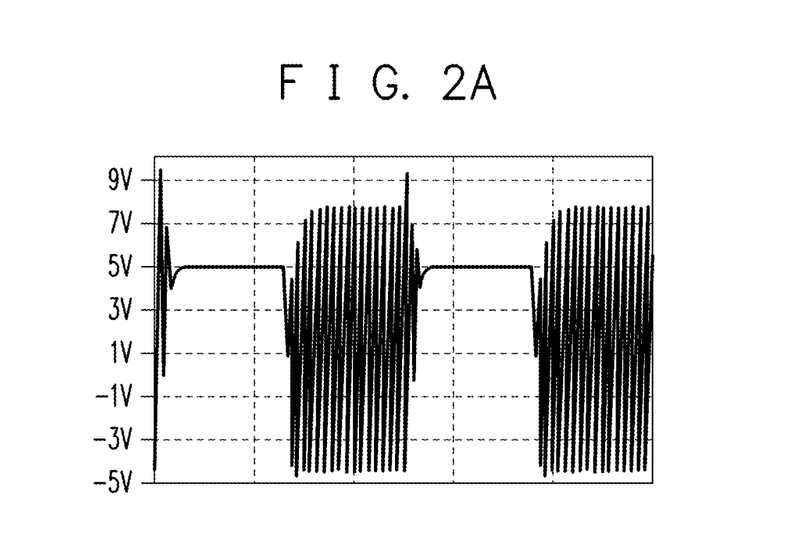
FIG. 2A and FIG. 2B are diagrams illustrating voltage waveforms of a semiconductor device from which a first capacitor, a second inductor and a switch circuit are deleted.
Figure 2B:
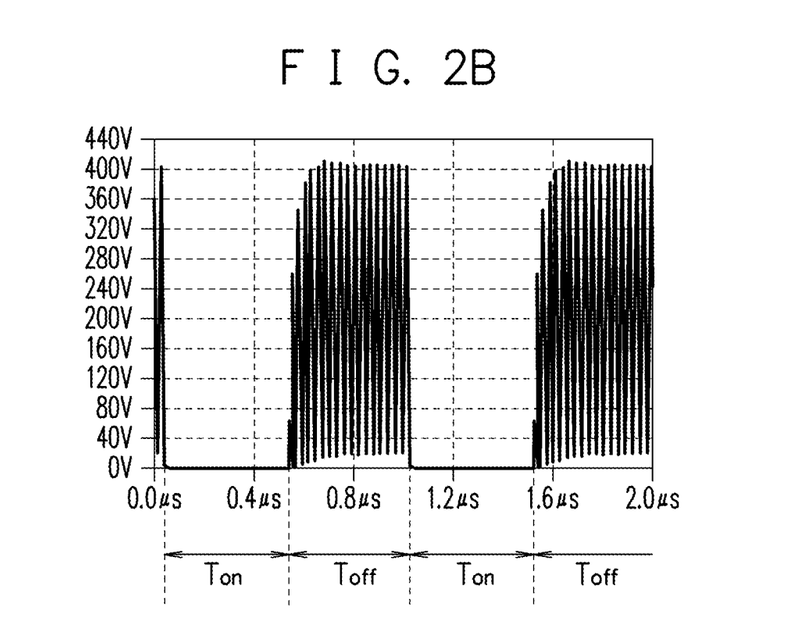

FIG. 2A and FIG. 2B are diagrams illustrating voltage waveforms of a semiconductor device being the semiconductor device in FIG. 1 from which the first capacitor 122, the second inductor 123 and the switch circuit 124 are deleted. FIG. 2A illustrates a waveform of a gate voltage of the node N2, and FIG. 2B illustrates a waveform of a drain voltage of the node N5. The gate signal generator 101 outputs 5 V during a period Ton, and outputs 0 V during a period Toff. When the parasitic inductors exist in the drains and the sources of the transistors S1 and S2, a self-turn-on of the transistors S1 and S2 repeatedly occurs, resulting in that the gate voltage and the drain voltage are made to be in an oscillation state. This destabilizes the operation of the semiconductor device. Therefore, in order to prevent the oscillation, the feedback circuit of the first capacitor 122 is provided.

Figure 3A:
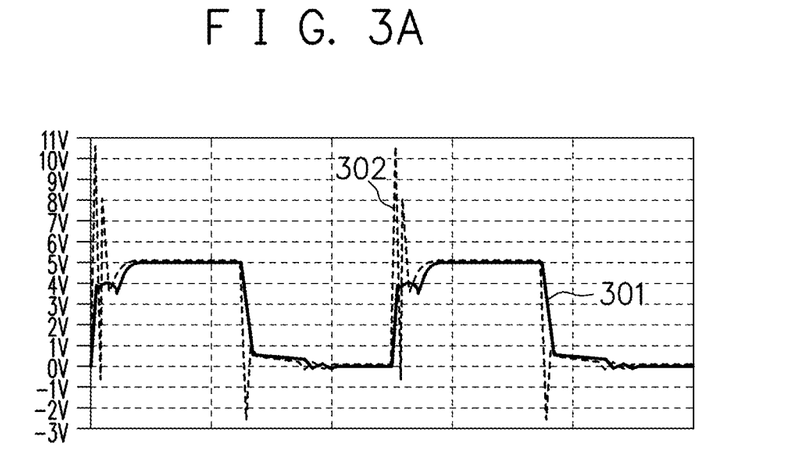
FIG. 3A and FIG. 3B are diagrams illustrating voltage waveforms of the semiconductor device in FIG. 1.
Figure 3B:
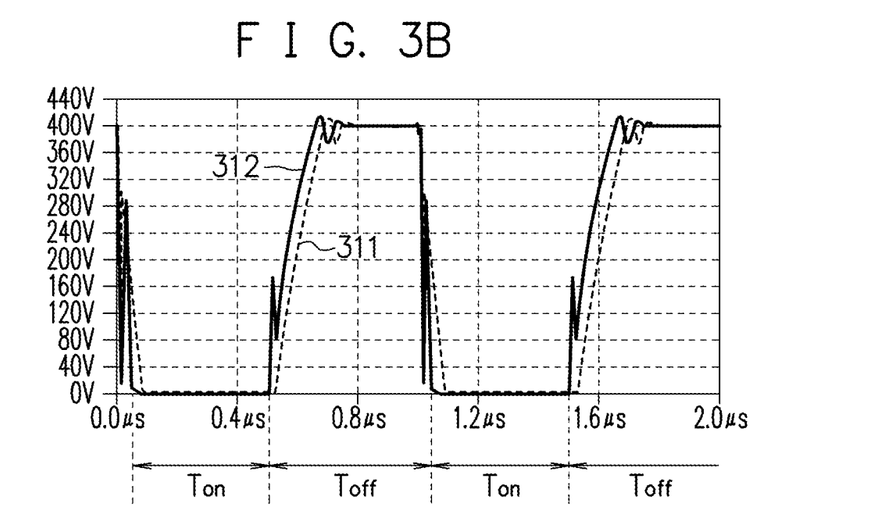

A gate voltage 301 of the node N2 in FIG. 3A and a drain voltage 311 of the node N5 in FIG. 3B indicate voltage waveforms of a semiconductor device being the semiconductor device in FIG. 1 in which the switch circuit 124 is deleted, and a series-connected circuit of the first capacitor 122 and the second inductor 123 is connected between the node N5 and the node N2. When the feedback circuit of the first capacitor 122 is provided, the first capacitor 122 cuts a direct-current portion, and makes only a variation portion to be fed back from the node N5 to the node N2. Consequently, it is possible to prevent the oscillation of the gate voltage 301 and the drain voltage 311, and to stabilize the operation. However, when the feedback circuit of the first capacitor 122 is provided, a rising speed and a falling speed of the gate voltage 301 and the drain voltage 311 become slow. Specifically, a switching speed of the transistors S1 and S2 becomes slow, which increases a power loss.

Accordingly, in order to increase the switching speed of the transistors S1 and S2 to reduce the power loss, the switch circuit 124 is provided. When FIG. 2A and FIG. 2B are referred to, it can be noticed that the oscillation of the gate voltage and the drain voltage occurs during the transistor-off-period Toff, and it does not occur during the transistor-on-period Ton. Accordingly, the switch A1 is turned on during the transistor-off-period Toff to make the feedback circuit of the first capacitor 122 to be effective, thereby suppressing the oscillation of the gate voltage and the drain voltage. On the contrary, during the transistor-on-period Ton, the switch A1 is turned off to make the feedback circuit of the first capacitor 122 to be ineffective, thereby increasing the rising speed and the falling speed of the gate voltage and the drain voltage, resulting in that the switching speed of the transistors S1 and S2 is increased.

Figure 4:
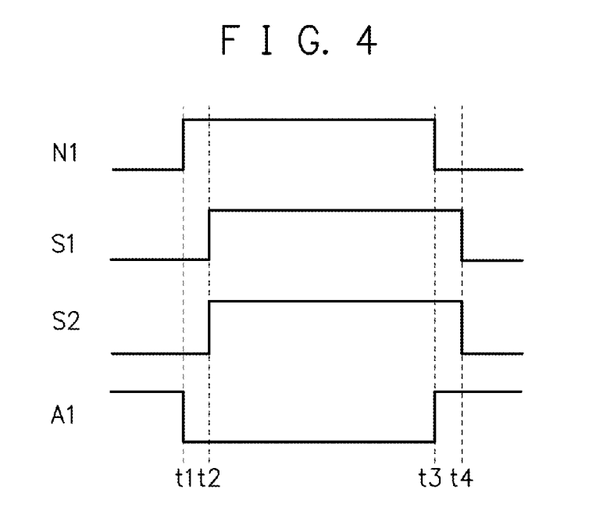
FIG. 4 is a timing chart illustrating a control method of the semiconductor device in FIG. 1.

FIG. 4 is a timing chart illustrating a control method of the semiconductor device in FIG. 1. The switch A1 is turned on during a period in which the gate voltage of the node N1 has a low-level (0 V), and is turned off during a period in which the gate voltage of the node N1 has a high-level (5 V). Due to a delay characteristic of the gate damping circuit 102, the gate voltage of the node N2 becomes a delayed voltage with respect to the gate voltage of the node N1. At a time t1, the gate voltage of the node N1 changes from the low-level to the high-level, resulting in that the switch A1 changes from the on-state to the off-state. As against the time t1, at a time t2 after a lapse of delay time of the gate damping circuit 102, the transistors S1 and S2 change from the off-state to the on-state. At the time t1 before the time t2, the switch A1 is changed from the on-state to the off-state. At the time t2, the switch A1 is turned off, so that the transistors S1 and S2 can be switched, at high speed, from the off-state to the on-state.

Further, at a time t3, the gate voltage of the node N1 changes from the high-level to the low-level, and the switch A1 changes from the off-state to the on-state. As against the time t3, at a time t4 after a lapse of delay time of the gate damping circuit 102, the transistors S1 and S2 change from the on-state to the off-state. In order to increase the speed of switching operation of the transistors S1 and S2, it is preferable that the switch A1 is kept to be turned off during a period from the time t3 to the time t4. However, even if the switch A1 is turned on at the time t3, due to a delay characteristic of the series-connected circuit of the second inductor 123 and the on-resistor 125, a current does not start flowing through the switch A1 at the time t3, and the current starts flowing through the switch A1 after the lapse of delay time. Accordingly, the current does not flow almost at all during the period from the time t3 to the time t4, which is substantially the same state as the state where the switch A1 is turned off. Therefore, at the time t4, the transistors S1 and S2 can be switched, at high speed, from the on-state to the off-state.

Note that although the example in which the switch A1 is turned on in accordance with the gate voltage of the node N1 is presented, the present embodiment is not limited to this. The switch A1 may only be one which is turned on during the period Toff in which the transistors S1 and S2 are in the off-state. It is preferable that the switch A1 is turned off before the time t2, and is turned on after the time t4.

A gate voltage 302 of the node N2 in FIG. 3A and a drain voltage 312 of the node N5 in FIG. 3B indicate voltage waveforms of the semiconductor device in FIG. 1. The gate voltage 302 and the drain voltage 312 indicate voltages when the switch circuit 124 is provided. The gate voltage 301 and the drain voltage 311 indicate voltages when the switch circuit 124 is not provided, and the first capacitor 122 and the second inductor 123 are connected between the node N2 and the node N5. A rising speed and a falling speed of the gate voltage 302 and the drain voltage 312 when the switch circuit 124 is provided are increased, compared to those of the gate voltage 301 and the drain voltage 311 when the switch circuit 124 is not provided. By providing the switch circuit 124, the speed of switching operation of the transistors S1 and S2 can be increased. Further, by providing the first capacitor 122, the oscillation of the gate voltage 302 and the drain voltage 312 is suppressed, similar to the gate voltage 301 and the drain voltage 311.

Figure 5A:
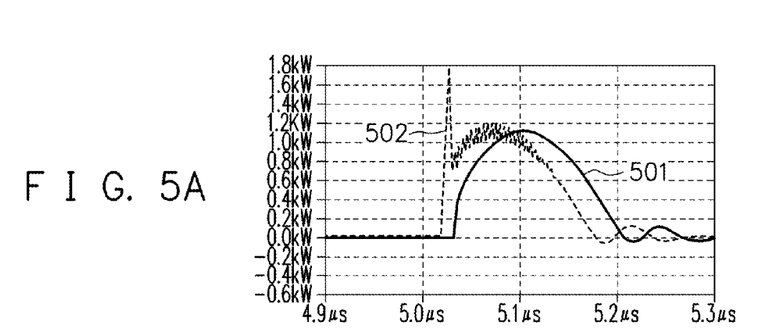
FIG. 5A is a diagram illustrating a temporal change of turn-on powers of a high electron mobility transistor.
Figure 5B:
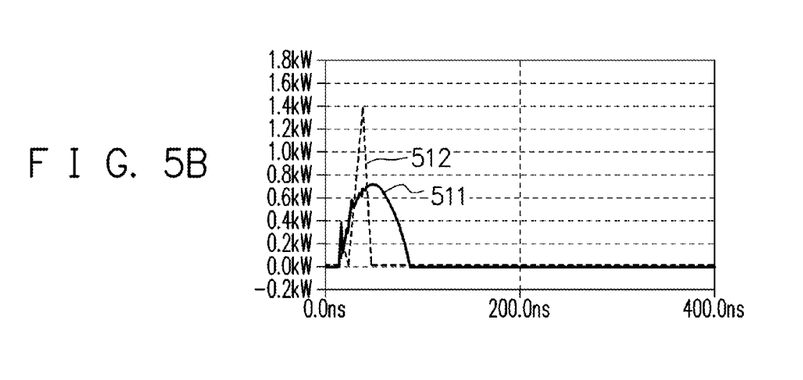
FIG. 5B is a diagram illustrating a temporal change of turn-off powers of the high electron mobility transistor.

FIG. 5A is a diagram illustrating a temporal change of turn-on powers of the high electron mobility transistor S2, and FIG. 5B is a diagram illustrating a temporal change of turn-off powers of the high electron mobility transistor S2 and illustrating simulation results under the following conditions. A frequency of the gate pulse signal output by the gate signal generator 101 is 100 kHz. The drain bias power supply 118 supplies a bias potential of 400 V. The load resistor 120 has 40Ω. The load inductor 121 has 0.5 µH. Each of the parasitic inductors of the sources of the transistors S1 and S2 has 20 nH, and each of the parasitic inductors of the gates of the transistors S1 and S2 has 5 nH, which is a condition in which the oscillation occurs if the feedback circuit is not provided.

In FIG. 5A, a turn-on power 501 indicates a loss power when the switch circuit 124 is not provided, and the first capacitor 122 and the second inductor 123 are connected between the node N2 and the node N5, in which the feedback circuit is constantly connected, and an average power per second is 13.5 W. A turn-on power 502 indicates a loss power of a semiconductor device when the switch circuit 124 is provided, and an average power per second is 13.1 W. The average power of the turn-on power 502 (13.1 W) becomes smaller than the average power of the turn-on power 501 (13.5 W). Note that when the turn-on of the high electron mobility transistor S2 occurs, an inflow current from the capacitor is generated, so that the effect such that the average power of the turn-on power 502 becomes smaller than the average power of the turn-on power 501, is relatively small.

In FIG. 5B, a turn-off power 511 indicates a loss power when the switch circuit 124 is not provided, and the first capacitor 122 and the second inductor 123 are connected between the node N2 and the node N5, in which the feedback circuit is constantly connected, and an average power per second is 3.74 W. A turn-off power 512 indicates a loss power of a semiconductor device when the switch circuit 124 is provided, and an average power per second is 1.90 W. The average power of the turn-off power 512 (1.90 W) becomes smaller, by about half, than the average power of the turn-off power 511 (3.74 W).

As described above, the average power of each of the turn-on power 502 and the turn-off power 512 in the present embodiment becomes small, resulting in that the power loss can be reduced.

Second Embodiment

Figure 6:
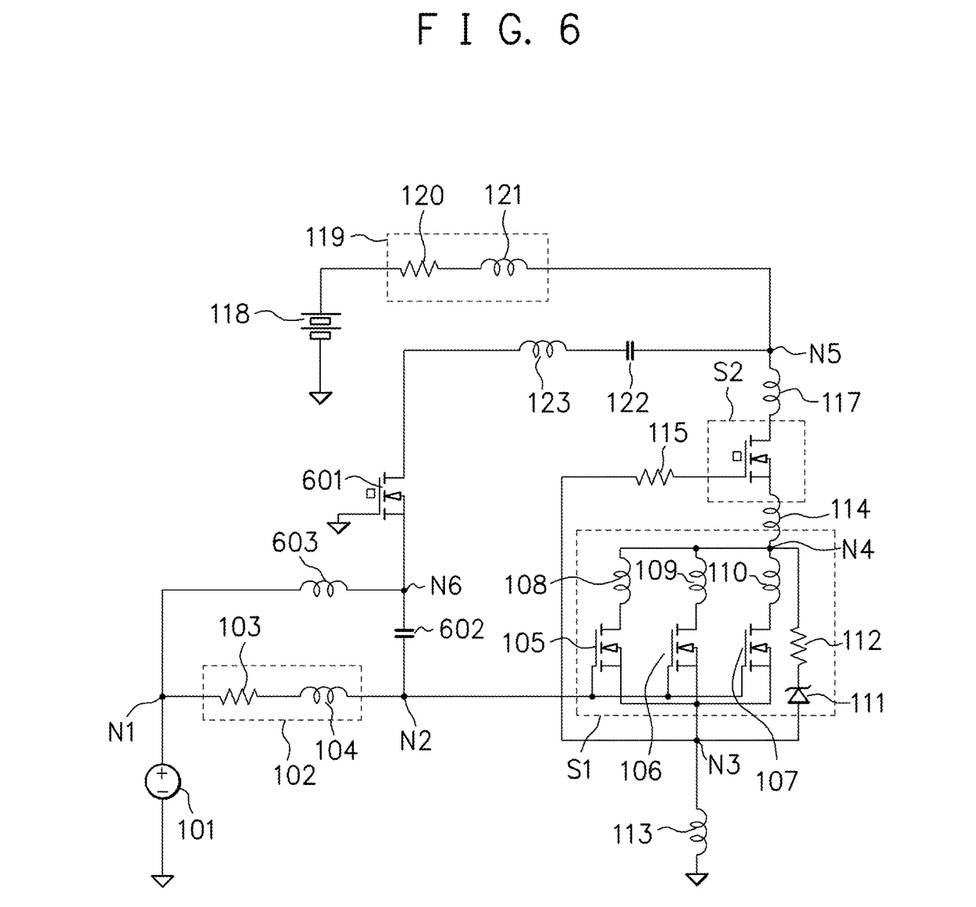
FIG. 6 is a diagram illustrating a configuration example of a semiconductor device according to a second embodiment.

FIG. 6 is a diagram illustrating a configuration example of a semiconductor device according to a second embodiment. When compared to the first embodiment (FIG. 1), the present embodiment (FIG. 6) illustrates a concrete example of the switch circuit 124. Hereinafter, a point at which the present embodiment is different from the first embodiment will be described. Note that when compared to the semiconductor device in FIG. 1, the semiconductor device in FIG. 6 can delete the parasitic inductor 116.

The switch circuit 124 has a third field-effect transistor 601, a second capacitor 602, and a parasitic inductor 603. The third field-effect transistor 601 has a drain connected to the node N5 via the first capacitor 122 and the second inductor 123, a gate connected to the reference potential node (ground potential node), and a source connected to a node N6. The second capacitor 602 is connected between the node N2 and the node N6, and has 100 pF, for example. The parasitic inductor 603 is connected between the node N1 and the node N6, and has 5 nH, for example. The second capacitor 602 is a capacitor for separating a gate bias of the node N2 and a feedback circuit of the node N6.

The third field-effect transistor 601 corresponds to a normally-on GaN (gallium nitride) high electron mobility transistor (HEMT). Therefore, when a voltage between the source and the gate is 0 V, the third field-effect transistor 601 is turned into an on-state, and an on-resistance is 20Ω or less. By using the high electron mobility transistor 601 as the switch circuit 124, it is possible to realize the switch circuit 124 with a small size.

Next, an operation of the semiconductor device will be described. When the gate signal generator 101 outputs the gate signal of low-level (0 V) to the node N1, the node N6 also takes 0 V. Since a gate potential becomes 0 V with respect to a source potential, the high electron mobility transistor 601 is turned on. When the node N1 is at a low-level, the transistors S1 and S2 are turned off. Therefore, during the period Toff in which the transistors S1 and S2 are turned off, the high electron mobility transistor 601 is turned on.

Further, when the gate signal generator 101 outputs the gate signal of high-level (10 V, for example) to the node N1, the node N6 also takes 10 V. Since the gate potential becomes −10 V with respect to the source potential, the high electron mobility transistor 601 is turned off. When the node N1 is at a high-level, the transistors S1 and S2 are turned on.

Therefore, during the period Ton in which the transistors S1 and S2 are turned on, the high electron mobility transistor 601 is turned off.

Figure 7A:
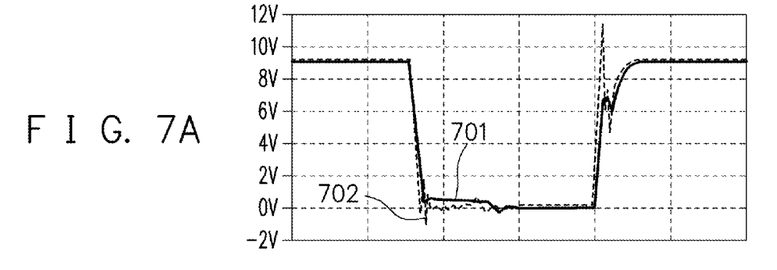
FIG. 7A and FIG. 7B are diagrams illustrating voltage waveforms of the semiconductor device in FIG. 6.
Figure 7B:
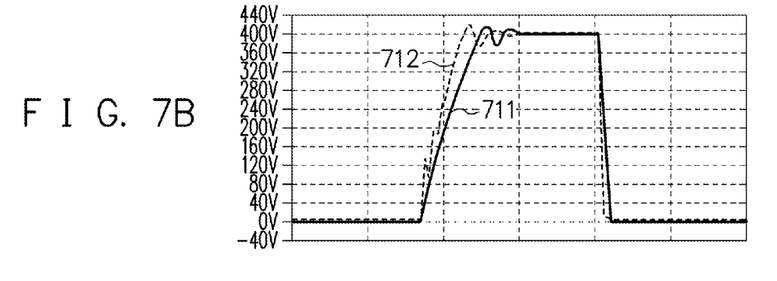

A gate voltage 702 of the node N2 in FIG. 7A and a drain voltage 712 of the node N5 in FIG. 7B indicate voltage waveforms of the semiconductor device in FIG. 1. The gate voltage 702 and the drain voltage 712 indicate voltages when the high electron mobility transistor 601, the second capacitor 602 and the parasitic inductor 603 are provided. A gate voltage 701 and a drain voltage 711 indicate voltages when the high electron mobility transistor 601, the second capacitor 602 and the parasitic inductor 603 are not provided, and the first capacitor 122 and the second inductor 123 are connected between the node N2 and the node N5. A rising speed and a falling speed of the gate voltage 702 and the drain voltage 712 when the high electron mobility transistor 601 and the like are provided are increased, compared to those of the gate voltage 701 and the drain voltage 711 when the high electron mobility transistor 601 and the like are not provided. By providing the high electron mobility transistor 601 and the like, the speed of switching operation of the transistors S1 and S2 can be increased. Further, by providing the first capacitor 122, the oscillation of the gate voltage 702 and the drain voltage 712 is suppressed, similar to the gate voltage 701 and the drain voltage 711.

Figure 7C:
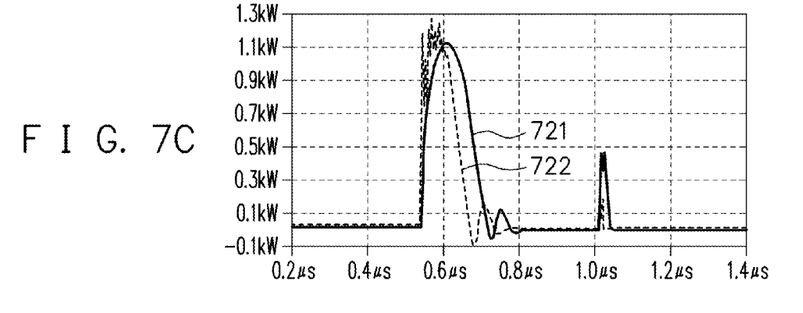
FIG. 7C is a diagram illustrating a temporal change of a turn-on power and a turn-off power of a high electron mobility transistor.

FIG. 7C is a diagram illustrating a temporal change of a turn-on power and a turn-off power of the high electron mobility transistor S2. The gate signal generator 101 outputs the low-level gate pulse signal of 0 V and the high-level gate pulse signal of 10 V to the node N1.

A power 721 indicates a loss power when the high electron mobility transistor 601, the second capacitor 602 and the parasitic inductor 603 are not provided, and the first capacitor 122 and the second inductor 123 are connected between the node N2 and the node N5, in which the feedback circuit is constantly connected. An average power per second of turn-on power out of the power 721 is 13.5 W. A power 722 indicates a loss power when the high electron mobility transistor 601, the second capacitor 602 and the parasitic inductor 603 are provided. An average power per second of turn-on power out of the power 722 is 10.1 W, which is smaller than the average power per second of the turn-on power out of the power 721 (13.5 W).

An average power per second of turn-off power out of the power 721 is 1 W. Further, an average power per second of turn-off power out of the power 722 is 0.262 W, which is smaller than the average power per second of the turn-off power out of the power 721 (1 W).

As described above, the average power of each of the turn-on power and the turn-off power in the present embodiment becomes small, resulting in that the power loss can be reduced. Note that there is almost no loss power due to the switching of the high electron mobility transistor 601 as the switch circuit 124.

Third Embodiment

Figure 8A:
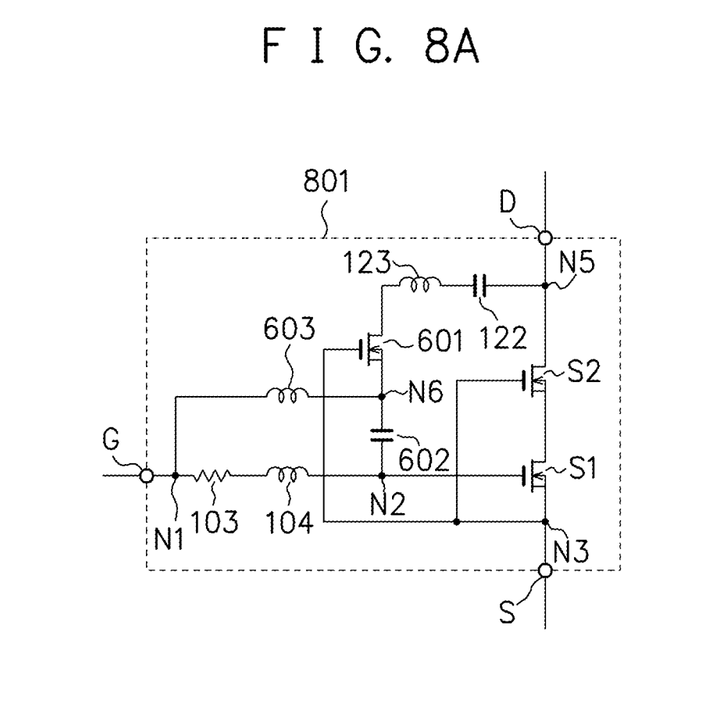
FIG. 8A is a diagram illustrating a configuration example of a semiconductor device of three-terminal package according to a third embodiment.

FIG. 8A is a diagram illustrating a configuration example of a semiconductor device of three-terminal package according to a third embodiment. A three-terminal package 801 has a drain terminal D, a gate terminal G, and a source terminal S. Further, the three-terminal package 801 has the semiconductor device in FIG. 6 (excluding the gate signal generator 101, the drain bias power supply 118 and the load 119) built therein. The drain terminal D is connected to the node N5, the gate terminal G is connected to the node N1, and the source terminal S is connected to the node N3. Further, in the three-terminal package 801, the parasitic inductors 114, 116 and 117, and the resistor 115 are deleted from the semiconductor device in FIG. 6. The gate of the high electron mobility transistor 601 is connected to the node N3. The three-terminal package 801 can be used by replacing a normal three-terminal field-effect transistor, and has an advantage that it can realize the high withstand voltage and the increase in speed.

Figure 8B:
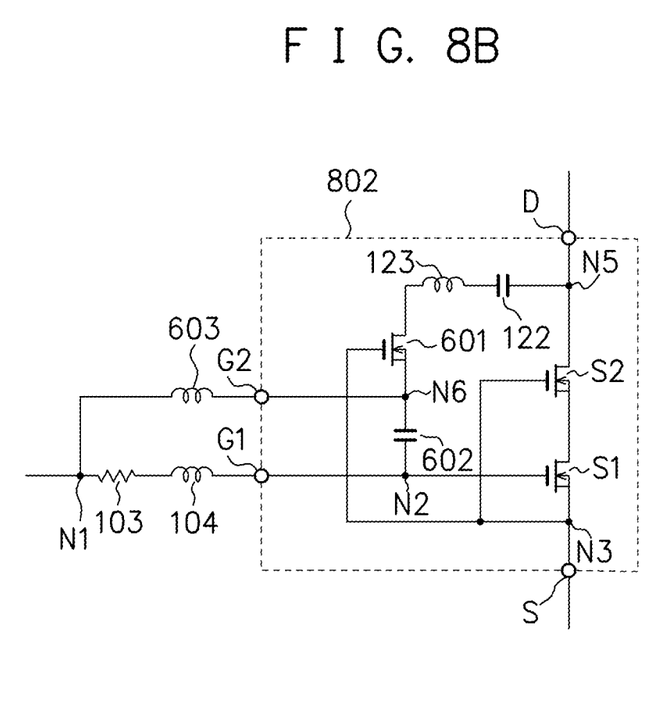
FIG. 8B is a diagram illustrating a configuration example of a semiconductor device of four-terminal package according to the third embodiment.

FIG. 8B is a diagram illustrating a configuration example of a semiconductor device of four-terminal package according to the third embodiment. The four-terminal package 802 has the drain terminal D, a first gate terminal G1, a second gate terminal G2, and the source terminal S. Further, the four-terminal package 802 corresponds to the three-terminal package 801 in FIG. 8A from which the resistor 103, and the inductors 104 and 603 are deleted. The first gate terminal G1 is connected to the node N2. The second gate terminal G2 is connected to the node N6. The resistor 103 and the inductors 104 and 603 are externally connected to the four-terminal package 802. Accordingly, there is an advantage that, by changing values of the resistor 103 and the inductors 104 and 603, the delay time between the time t1 and the time t2 and the delay time between the time t3 and the time t4 in FIG. 4 are adjusted, resulting in that the operation of the semiconductor device can be easily optimized.

As described above, according to the first to third embodiments, by providing the first capacitor 122, the oscillation can be prevented, and the operations of the first and second field-effect transistors S1 and S2 can be stabilized. Further, by providing the switch circuit 124, the speed of operations of the first and second field-effect transistors S1 and S2 can be increased.

Note that the above-described embodiments merely illustrate concrete examples of implementing the present embodiments, and the technical scope of the present embodiments is not to be construed in a restrictive manner by these embodiments. That is, the present embodiments may be implemented in various forms without departing from the technical spirit or main features thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device, comprising:
   a first field-effect transistor configured to have a source connected to a reference potential node;
   a second field-effect transistor configured to have a source connected to a drain of the first field-effect transistor, and a gate connected to the source of the first field-effect transistor;
   a gate signal node configured to input a gate signal therein;
   a first resistor configured to be connected between the gate signal node and a gate of the first field-effect transistor; and a first capacitor and a switch circuit configured to be directly connected between a drain of the second field-effect transistor and the gate of the first field-effect transistor, wherein the switch circuit is connected in series with the first capacitor, and the switch circuit is turned on during a period in which the first field-effect transistor is in an off-state.

2. The semiconductor device according to claim 1, wherein the switch circuit is turned on in accordance with the signal of the gate signal node.

3. The semiconductor device according to claim 1, wherein the drain of the second field-effect transistor is connected to a drain bias potential node via a load.

4. The semiconductor device according to claim 1, further comprising:

a first inductor configured to be connected in series with the first resistor; and a second inductor configured to be connected in series with the first capacitor.

5. The semiconductor device according to claim 1, wherein the switch circuit comprises an on-resistor.

6. The semiconductor device according to claim 1, wherein the switch circuit comprises:

a third field-effect transistor configured to have a drain connected to the first capacitor, a gate connected to the reference potential node, and a source connected to the gate signal node; and a second capacitor configured to be connected between the source of the third field-effect transistor and the gate of the first field-effect transistor.

7. The semiconductor device according to claim 6, wherein the third field-effect transistor is a high electron mobility transistor.

8. The semiconductor device according to claim 6, wherein the third field-effect transistor is a normally-on transistor.

9. The semiconductor device according to claim 6, wherein the third field-effect transistor is a normally-on high electron mobility transistor.

10. A semiconductor device, comprising:

a first field-effect transistor configured to have a source connected to a reference potential node;

a second field-effect transistor configured to have a source connected to a drain of the first field-effect transistor, and a gate connected to the source of the first field-effect transistor;

a gate signal node configured to input a gate signal therein;

a first resistor configured to be connected between the gate signal node and a gate of the first field-effect transistor; and a first capacitor and a switch circuit configured to be connected between a drain of the second field-effect transistor and the gate of the first field-effect transistor, wherein the switch circuit is connected in series with the first capacitor, wherein:

the first field-effect transistor is a MOS field-effect transistor; and the second field-effect transistor is a high electron mobility transistor.

11. A semiconductor device, comprising:

a first field-effect transistor configured to have a source connected to a reference potential node;

a second field-effect transistor configured to have a source connected to a drain of the first field-effect transistor, and a gate connected to the source of the first field-effect transistor;

a gate signal node configured to input a gate signal therein;

a first resistor configured to be connected between the gate signal node and a gate of the first field-effect transistor; and a first capacitor and a switch circuit configured to be connected between a drain of the second field-effect transistor and the gate of the first field-effect transistor, wherein the switch circuit is connected in series with the first capacitor, wherein:

the first field-effect transistor is a normally-off transistor; and the second field-effect transistor is a normally-on transistor.

12. A semiconductor device, comprising:

a first field-effect transistor configured to have a source connected to a reference potential node;

a second field-effect transistor configured to have a source connected to a drain of the first field-effect transistor, and a gate connected to the source of the first field-effect transistor;

a gate signal node configured to input a gate signal therein;

a first resistor configured to be connected between the gate signal node and a gate of the first field-effect transistor; and a first capacitor and a switch circuit configured to be connected between a drain of the second field-effect transistor and the gate of the first field-effect transistor, wherein the switch circuit is connected in series with the first capacitor, wherein:

the first field-effect transistor is a normally-off MOS field-effect transistor; and the second field-effect transistor is a normally-on high electron mobility transistor.

* * * * *